United States Patent [19]

Nishimura

[11] Patent Number: 5,488,507
[45] Date of Patent: Jan. 30, 1996

[54] SEMICONDUCTOR OPTICAL AMPLIFIER HAVING REDUCED POLARIZATION DEPENDENCE

[75] Inventor: Michiyo Nishimura, Sagamihara, Japan

[73] Assignee: Canon Kabushiki Kaisha, Tokyo, Japan

[21] Appl. No.: 306,400

[22] Filed: Sep. 15, 1994

[30] Foreign Application Priority Data

Oct. 4, 1993 [JP] Japan .................. 5-271330

[51] Int. Cl.⁶ ........................................ G02F 02/00
[52] U.S. Cl. ............................ 359/344; 257/18; 372/45
[58] Field of Search ................ 385/11, 131; 257/18, 257/187, 432; 359/344, 488; 372/45

[56] References Cited

U.S. PATENT DOCUMENTS

| | | | |
|---|---|---|---|
| 4,952,792 | 8/1990 | Caridi | 250/211 J |
| 5,090,790 | 2/1992 | Zucker | 385/130 |
| 5,117,469 | 5/1992 | Cheung et al | 385/11 |
| 5,296,721 | 3/1994 | Schulman et al | 257/25 |

FOREIGN PATENT DOCUMENTS

| | | | |
|---|---|---|---|
| 0469681 | 2/1992 | European Pat. Off. ...... | H01S 3/25 |
| 1257386 | 10/1989 | Japan . | |
| 1251685 | 10/1989 | Japan . | |
| 3179428 | 8/1991 | Japan .................. | G02F 1/17 |
| 4027183 | 1/1992 | Japan . | |

OTHER PUBLICATIONS

M. A. Newkirk et al., '1.5 um Multiquantum–Well Semiconductor Optical Amplifier with Tensile and Compressively Strained Wells for Polarization–Independent Gain', IEEE Photonics Technology Letters, vol. 5, No. 4, Apr. 1993, New York, US, pp. 406–408, XP368317.

A. Mathur et al., 'Polarization Insensitive Strained Quantum Well Gain Medium for Lasers and Optical Amplifiers', Applied Physics Letters, vol. 61, No. 24, 14 Dec. 1992, New York, US, pp. 2845–2847, XP335086.

K. Magari et al., '1.55 um Polarization–Insensitive High–Gain Tensile–Strained–Barrier MQW Optical Amplifier', IEEE Photonics Technology Letters, vol. 3, No. 11, Dec. 1991, New York, US, pp. 998–1000, XP232692.

M. Joma et al., 'Polarization Insensitive Semiconductor Laser Amplifiers with Tensile Strained InGaAsP/InGaAsP Multiple Quantum Well Structure', Applied Physics Letters, vol. 62, No. 2, 11 Jan. 1993, New York, US, pp. 121–122, XP332224.

*Primary Examiner*—Mark Hellner
*Attorney, Agent, or Firm*—Fitzpatrick, Cella, Harper & Scinto

[57] ABSTRACT

A semiconductor optical amplifier comprises a substrate and an active layer constructed as a quantum well structure. The active layer includes a plurality of well layers and a plurality of barrier layers which are alternately layered. The composition of each well layer is such that the well layers have different quantum levels. The barrier layers are subjected to biaxial strain to shift the energy band structures so as to eliminate the polarization dependency of optical gain in the active region.

6 Claims, 5 Drawing Sheets

SEMICONDUCTOR OPTICAL AMPLIFIER HAVING REDUCED POLARIZATION DEPENDENCE

BACKGROUND OF THE INVENTION

1. Field of the Invention

The present invention relates to a semiconductor optical device, such as a semiconductor optical amplifier.

2. Description of Related Background Art

Generally, a semiconductor optical amplifier or amplifying apparatus is provided with a semiconductor laser structure which includes an active layer, a clad layer and the like. The semiconductor optical amplifier performs optical amplification for input light from outside, under bias current below its threshold injected thereinto. In optical communications, the optical amplifier has been developed as a device for compensating for optical loss which occurs in an optical fiber, at connections between fibers, etc.

However, when such semiconductor optical amplifiers are used in optical fiber communication systems, there exists the problem of polarization dependency of an optical amplification factor (i.e., amplification factors differ for different polarization modes). In general, the polarization state of output light transmitted through the optical fiber fluctuates with time. As a result, if such output light is supplied to the above-mentioned optical amplifier with polarization dependency, the level of output light from the optical amplifier will be unstable and fluctuate with time. Therefore, a receiver system is required to have a wide dynamic range, and various burdens are imposed on the receiver system. This is a fatal drawback that limits the scale of optical systems or networks.

Therefore, various efforts have been proposed for constructing a polarization insensitive optical amplifier (i.e., amplification factors for different polarization modes are substantially equal to each other). Among them, there has been proposed a method of using a strained quantum well structure for solving the polarization dependency of optical gain in its active layer. The strained quantum well structure has been used for controlling the oscillation wavelength and reducing the oscillation gain threshold in the field of semiconductor lasers as well as in the field of amplifiers, and thus the strained quantum well structure is a very useful technique.

Generally, the gain for transverse magnetic (TM) light is made equal to or larger than the gain for transverse electric (TE) light to achieve a polarization insensitive optical amplifier by using such a strained quantum well structure. In more detail, the degeneracy in a valence band is released by the effect of strain, and band structures of heavy and light holes are respectively shifted to make the transition energy between an electron ground level in a conduction band and a level of heavy holes (HH) in the valence band approximately equal to, or slightly larger than the transition energy between an electron ground level in the conduction band and a level of light holes (LH) in the valence band. When there is no other gain polarization dependency than the optical gain polarization dependency, those transition energies are made equal to each other. When there are other gain polarization dependencies than the optical gain polarization dependency, the latter transition energy is made smaller than the former. The light confinement for TE light is generally greater than that for TM light, so that the latter transition energy is made smaller than the former.

Several methods have been proposed for imparting strain to a quantum well structure so that the above-discussed desired energy levels can be obtained.

First, Japanese Patent Laid-Open Application No. 1-251685 discloses a method of imparting biaxial tensile strain to a well layer. The biaxial tensile strain is imparted to a second semiconductor layer by layering the second semiconductor layer on a first reference semiconductor layer (a substrate or a clad layer). The lattice constant of the second semiconductor layer is smaller than that of the first semiconductor layer. Since the biaxial tensile strain is imparted to the well layer, the band edge of light holes in the valence band is shifted towards a direction to narrow the band gap in the second semiconductor layer. As a result, the energy level of light holes in the valence band is lowered and approaches the energy level of heavy holes. Thus, desired levels can be obtained.

Second, Japanese Patent Laid-Open Application No. 4-27183 discloses a method of imparting biaxial tensile strain to a barrier layer. In a manner similar to the first prior art method, the band edge of light holes in the valence band of the barrier layer is shifted due to the effect of strain. As a result, a well of light holes becomes shallow and its energy level shifts. Thus, desired levels can be obtained.

Third, Japanese Patent Laid-Open Application No. 1-257386 discloses a method of forming an active layer that includes two kinds of well layers: a strained (biaxial tensile strain) well layer and a non-strained well layer.

Various problems, however, exist in those prior art methods. In the first prior art method in which the biaxial tensile strain is imparted to the well layer, though a large amount of energy shift can be obtained by a small amount of strain, the band gap of the well varies, and hence the wavelength, at which gain is obtained, also varies. In the second prior art method in which the biaxial tensile strain is imparted to the barrier layer, the wavelength, at which gain is obtained, remains almost unchanged, contrary to the first prior art method. However, a larger amount of strain is needed than the first prior art method to obtain a desired effect. Further, in the first and-second prior art methods, levels of HH and LH in one well are brought close to each other, so that the band mixing between HH and LH occurs. Thus, effective masses of the respective holes are greatly different from each other. As a result, a large number of carriers need to be injected into one well to obtain a large gain from an optical amplifier. Hence, unfavorable degradation of characteristics is likely to occur because of Joule heat generation and the like by high-density carrier injection.

Compared with those prior art methods, in the third prior art method in which the strained well is combined with the non-strained well, ground levels of HH and LH are respectively provided in the two wells, so that the band mixing effect in one well is reduced. Thus, the degradation of characteristics due to high-density carrier injection can be prevented. However, it is difficult to match the transition wavelengths of HH and LH with each other because of energy shift in the conduction band by strain.

SUMMARY OF THE INVENTION

It is an object of the present invention to provide a semiconductor optical device, such as a semiconductor optical amplifier, which includes strained barrier layers and different kinds of well layers so that polarization insensitivity and preferable performance are obtained.

According to one aspect of the present invention which achieves the objective, a semiconductor optical device comprises a substrate and an active layer of a quantum well structure. The active layer includes a plurality of well layers and a plurality of barrier layers which are alternately layered. The well layers have different quantum levels and the barrier layers are respectively subjected to biaxial strain.

More specifically, the barrier layers may respectively be subjected to a predetermined biaxial strain. The well layers are not subjected to biaxial strain and the well layers may be different from each other in at least one of composition and well width. A ground level in a valence band of one of at least two well layers is a level of heavy holes, a ground level in the valence band of the other of the at least two well layers is a level of light holes, and inter-band transitions between an electron level in a conduction band and the level of heavy holes in the one well layer and between an electron level in a conduction band and the level of light holes in the other well layer occur at substantially the same wavelength. A ground level in a valence band of still another well layer may be a level of light holes for compensating for an optical transition of light holes during high-density carrier injection. A semiconductor optical device may be constructed as a semiconductor optical amplifier for imparting gain to input light from outside.

These and other objects, features, and advantages of the present invention will become more apparent upon consideration of the following detailed description of the preferred embodiments when read in conjunction with the attached drawings.

DESCRIPTION OF THE PREFERRED EMBODIMENT

Figure 1:
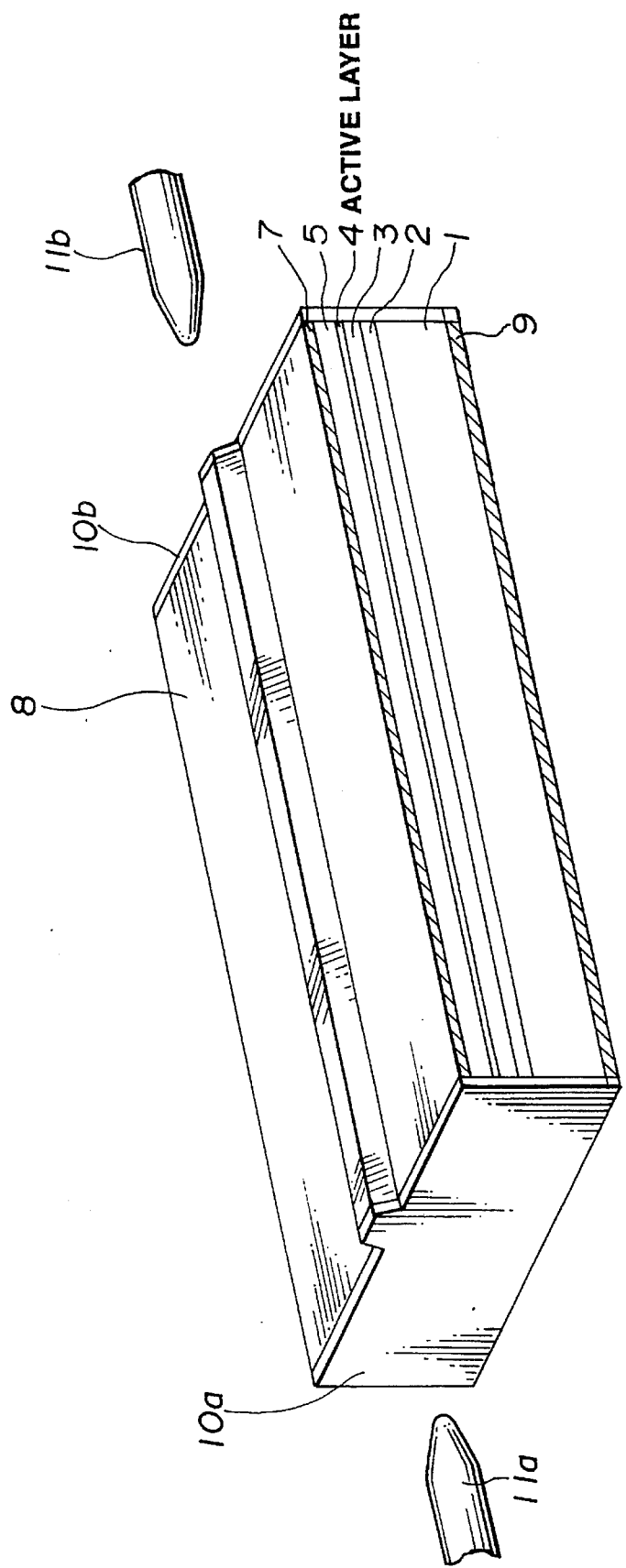
FIG. 1 is a perspective view illustrating a a first embodiment of the present invention.
Figure 2:
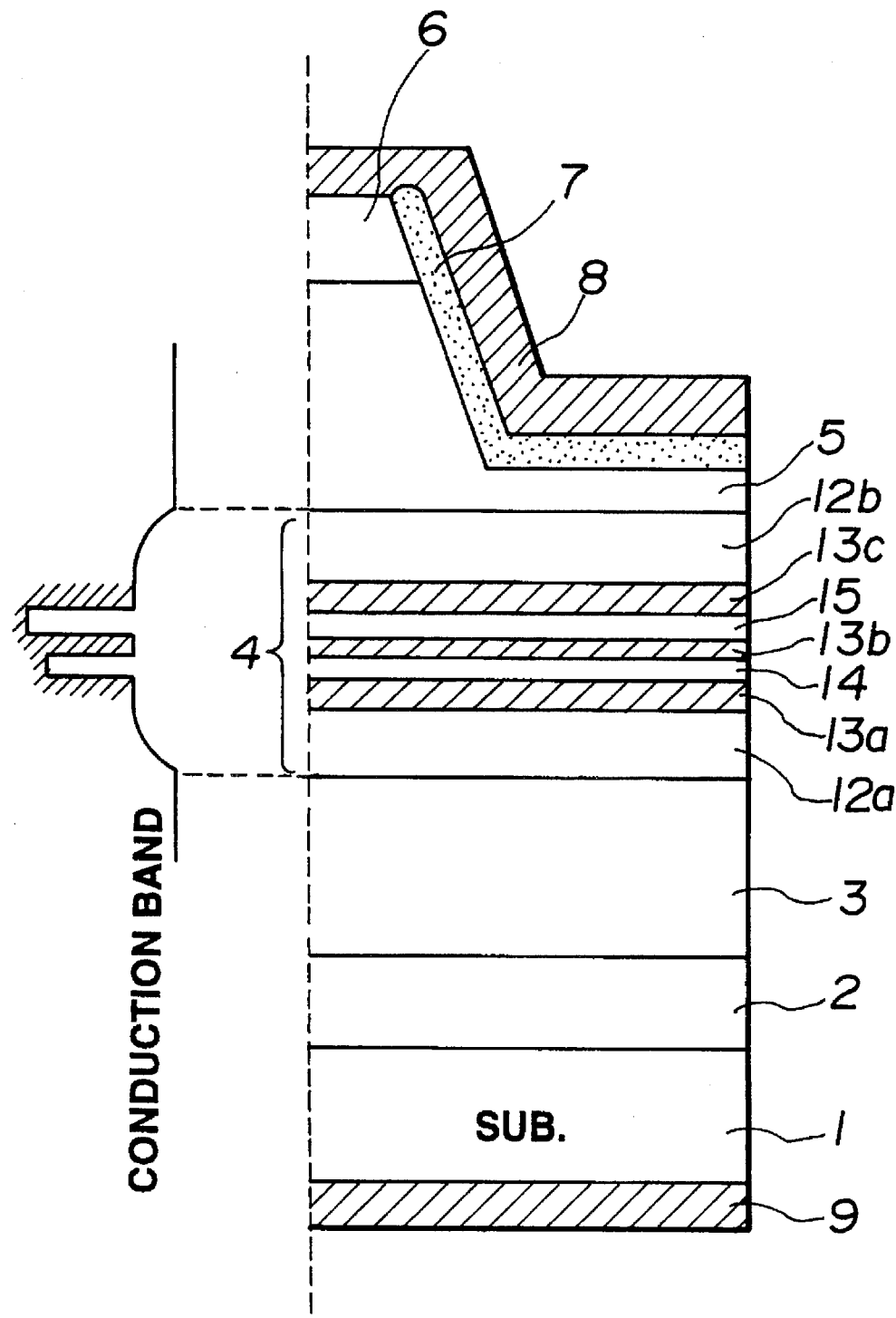
FIG. 2 is a cross-sectional view illustrating a right-half portion of the first embodiment of the present invention.

FIGS. 1 and 2 show a first embodiment of the present invention. FIG. 1 shows the entire structure of the first embodiment, and FIG. 2 shows a right-half of a cross section of the first embodiment and the band structure of an active layer.

In the first embodiment, on a (100) oriented crystal semiconductor substrate 1 of n-GaAs, an n-GaAs buffer layer 2 having a thickness of 1 μm, an n-$Al_{0.5}Ga_{0.5}As$ clad layer 3 having a thickness of 1.5 μm, an undoped strained quantum well active layer 4 of a graded index, separate confinement heterostructure (GRIN-SCH), a p-$Al_{0.5}Ga_{0.5}As$ clad layer 5 having a thickness of 1.5 μm, and a p-GaAs cap layer 6 having a thickness of 0.5 μm are formed in this order by using metal organic chemical vapor deposition (MOCVD) method.

Then, etching is performed to a depth halfway through the p-$Al_{0.5}Ga_{0.5}As$ clad layer 5 with a raised stripe portion having a width of 3 μm being left. After an insulating layer 7 of silicon nitride is deposited over the entire surface, only the insulating layer on the upper surface of the stripe is removed. Further, an upper electrode 8 of Au—Cr is deposited on the entire top surface, and a lower electrode 9 of Au—Ge is deposited on the bottom surface of the substrate 1. Thus, a ridge type laser structure is fabricated.

Then, the wafer is cleaved into a generally rectangular shape, with a length of 500 μm in a direction perpendicular to the stripe. Antireflection coatings 10a and 10b are formed on opposite end facets by depositing $ZrO_2$ thereon, using an electron beam deposition method.

Lensed optical fibers 11a and 11b are positioned near the end facets of the device, by which signal light is input and output into and from the device.

A traveling type semiconductor optical amplifier can thus be constructed as illustrated in FIG. 1, and gain can be imparted to external signal light between the optical fibers 11a and 11b.

The detail of the strained quantum well active layer 4 and its effect will be described. The active layer 4 is comprised of an $Al_xGa_{1-x}As$ (x changes from 0.5 to 0.25) GRIN layer 12a having a thickness of 0.2 μm, a $GaAs_{0.75}P_{0.25}$ barrier layer 13a having a thickness of 12 nm, an $Al_{0.05}Ga_{0.95}As$ well layer 14 having a thickness of 10 nm (a first well layer), a $GaAs_{0.75}P_{0.25}$ barrier layer 13b having a thickness of 12 nm, an GaAs well layer 15 having a thickness of 6 nm (a second well layer), a $GaAs_{0.75}P_{0.25}$ barrier layer 13c having a thickness of 12 nm, and an $Al_xGa_{1-x}As$ (x changes from 0.25 to 0.5) GRIN layer 12 having a thickness of 0.2 μm which are layered in this order. In this structure, lattice matching between the two well layers 14 and 15 and the substrate 1 is established, and the three barrier layers 13a–13c, which sandwich the two well layers 14 and 15, are subjected to substantially the same strain due to the lattice mismatching between the barriers 13a–13c and the substrate 1. The strain is biaxial tensile strain, of approximately −0.9%.

Figure 3:
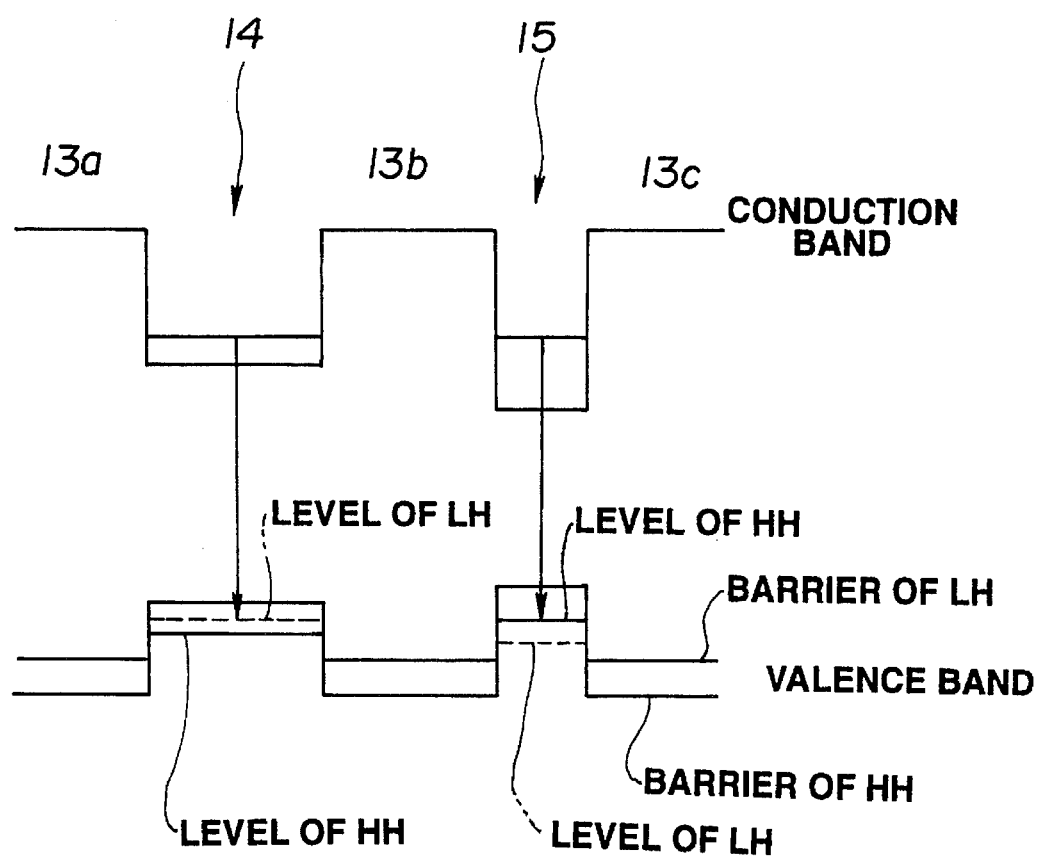
FIG. 3 is a band diagram illustrating the band structure of an active layer of the first embodiment.

The band structure of the above structure is illustrated in FIG. 3. In this embodiment, strain is introduced into the barrier layers 13a–13c, and the band structure thereof differs from that of a non-strain structure. The composition and width of the wells need to be changed to achieve a state in which a ground level in one well 15 is a level of HH and a ground level in the other well 14 is a level of LH. Further, it is critical that optical transitions between LH in the valence band of the first well 14 and electrons in the conduction band and between HH in the valence band of the second well 15 and electrons in the conduction band are caused at about the same wavelength as shown in FIG. 3. Thereby, gains for TE light and TM light are equal to each other, and hence the polarization insensitive characteristic of gain is obtained by the entire structure of the active layer 4.

Figure 4:
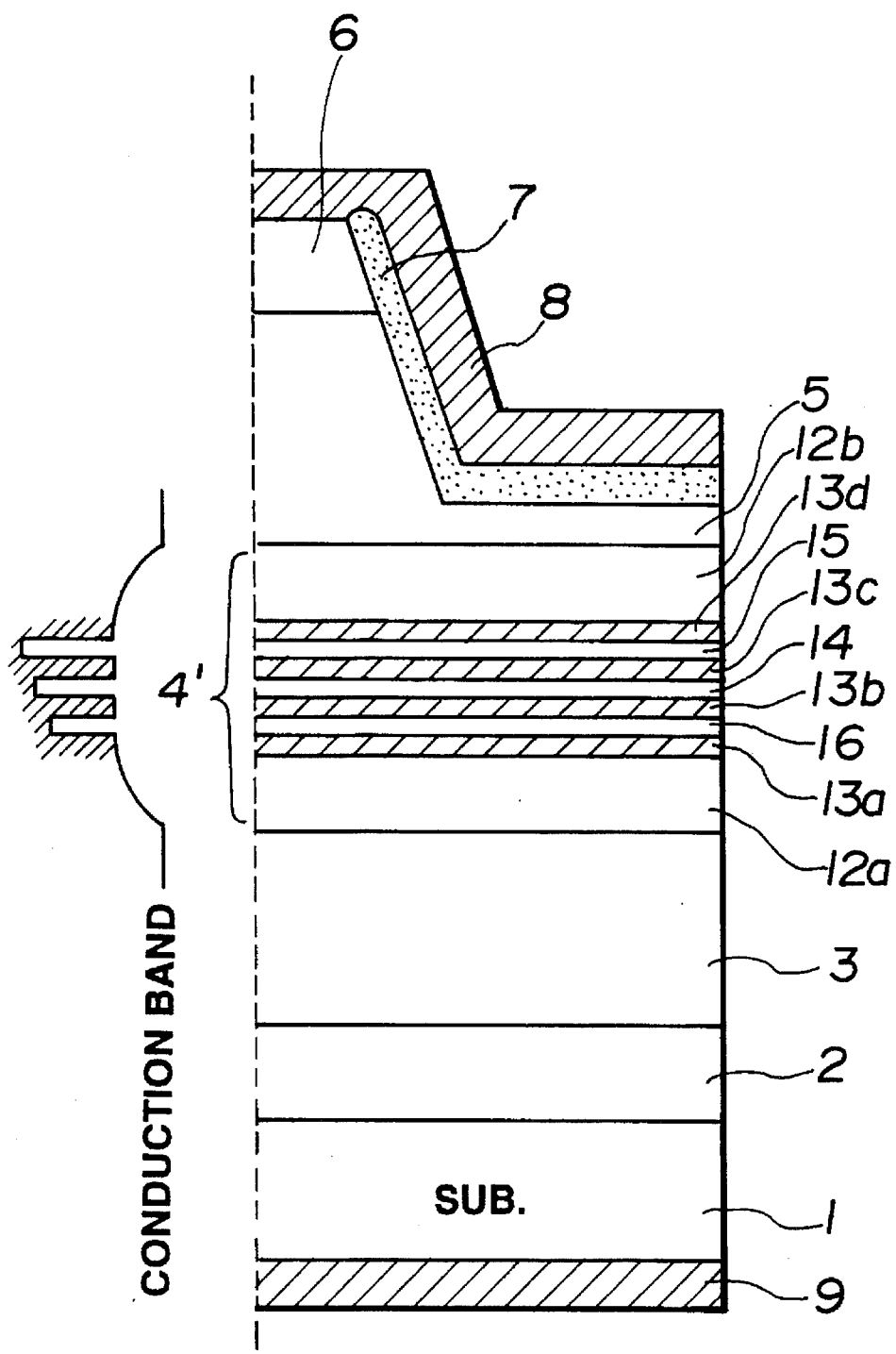
FIG. 4 is a cross-sectional view illustrating a right-half portion of a second embodiment of the present invention.
Figure 5:
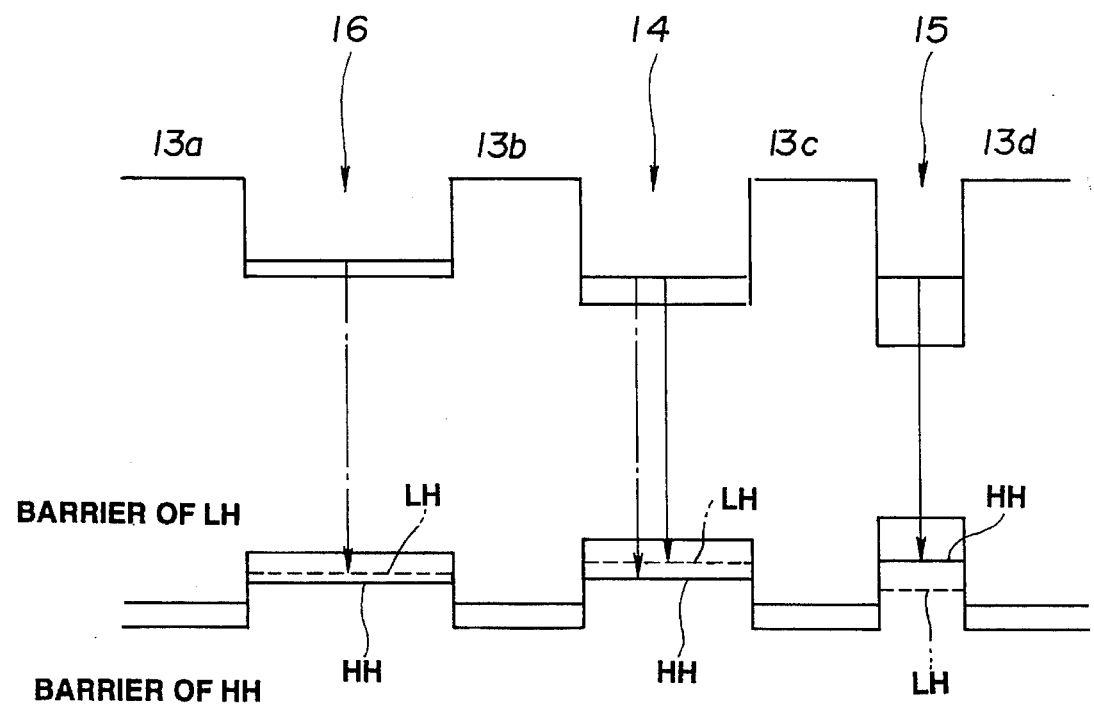
FIG. 5 is a band structure illustrating the band structure of an active layer of the second embodiment.

FIG. 4 shows a second embodiment of the present invention. In the second embodiment, the number of well layers is three, which is different from the first embodiment. The fundamental effect of the second embodiment is the same as the first embodiment.

The active layer 4' of the second embodiment is comprised of an $Al_xGa_{1-x}As$ (x changes from 0.5 to 0.25) GRIN layer 12a having a thickness of 0.2 μm, a $GaAs_{0.75}P_{0.25}$ barrier layer 13a having a thickness of 12 nm, an $Al_{0.08}Ga_{0.92}As$ well layer 16 having a thickness of 15 nm (a first well layer), a $GaAs_{0.75}P_{0.25}$ barrier layer 13b having a thickness of 12 nm, an $Al_{0.05}Ga_{0.95}As$ well layer 14 having a thickness of 10 nm (a second well layer), a $GaAs_{0.75}P_{0.25}$ barrier layer 13c having a thickness of 12 nm, an GaAs well layer 15 having a thickness of 6 nm (a third well layer), a $GaAs_{0.75}P_{0.25}$ barrier layer 13d having a thickness of 12 nm, and an $Al_xGa_{1-x}As$ (x changes from 0.25 to 0.5) GRIN layer 12b having a thickness of 0.2 μm which are layered in this order.

In this embodiment, in addition to the two wells 14 and 15 of the first embodiment, another well or the third well 16 is provided. Effect of the third well 16 will be described.

In the first and second wells 14 and 15, wavelengths of respective inter-band transitions are made equal to each other, and the polarization dependency of gain is eliminated in a state of low-density carrier injection. However, in HH and LH of the respective wells 14 and 15, polarization dependency of gain occurs in a state of high-density carrier injection because of a difference in effective mass and influence of a level next to the ground level. Anticipating the injection state to be used prior to use and shifting ground levels of the respective wells, is an effective solution, but in this case, polarization dependency would occur in the low-density carrier injection range. The third well 16 is provided for compensating for this drawback, and eliminates the polarization dependency in a state of high-density carrier injection. Namely, in the third well 16, the ground level is a level of LH to compensate for the optical transition of LH, which is disadvantageous at the time of high-density injection. At the time of low-density injection, the two wells 14 and 15 serve to eliminate the polarization dependency during low-density carrier injection, while the three wells 14, 15 and 16 serve to eliminate the polarization dependency during high-density carrier injection. Thus, the wavelength range of amplified light without any polarization dependency is expanded.

In the above embodiments, the substrate is composed of GaAs, but the present invention is not limited to GaAs material series. The present invention is effective when InP series, other group III–V material and group II–VI material are also used.

As described in the foregoing, according to the present invention, strain is imparted to a barrier layer, and a plurality of well layers, which are different in at least one of composition and well width, are provided. Therefore, a semiconductor optical amplifier and the like, which reduces the polarization dependency of gain, can be achieved.

While the present invention has been described with respect to what are presently considered to be the preferred embodiments, it is to be understood that the invention is not limited to the disclosed embodiments. The present invention is intended to cover various modifications and equivalent arrangements included within the sprit and scope of the appended claims.

What is claimed is:

1. A semiconductor optical device comprising:

a substrate; and an active layer of quantum well structure, said active layer including a plurality of well layers and a plurality of barrier layers which are alternately layered, said well layers having different quantum levels and said barrier layers being respectively subjected to biaxial strain, wherein each of said plurality of well layers has a polarization dependency and said plurality of well layers compensate for each polarization dependency of each other or one another.

2. A semiconductor optical device according to claim 1, wherein said barrier layers are respectively subjected to a predetermined biaxial strain.

3. A semiconductor optical device according to claim 1, wherein no well layers are subjected to biaxial strain and said well layers are different from each other in at least one of composition and well width.

4. A semiconductor optical device according to claim 1, wherein a ground level in a valence band of one of at least two well layers is a level of heavy holes, a ground level in the valence band of the other of the at least two well layers is a level of light holes, and inter-band transitions between an electron level in a conduction band and the level of heavy holes in said one well layer and between an electron level in a conduction band and the level of light holes in said the other well layer occur at substantially the same wavelength.

5. A semiconductor optical device according to claim 4, wherein a ground level in a valence band of still another well layer is a level of light holes for compensating for an optical transition of light holes during of high-density carrier injection.

6. A semiconductor optical device according to claim 1, wherein said device is constructed as a semiconductor optical amplifier for imparting gain to input light from outside.

* * * * *

UNITED STATES PATENT AND TRADEMARK OFFICE
CERTIFICATE OF CORRECTION

PATENT NO. : 5,488,507
DATED : January 30, 1996
INVENTOR(S) : MICHIYO NISHIMURA          Page 1 of 2

It is certified that error appears in the above-identified patent and that said Letters Patent is hereby corrected as shown below:

On the title page, item,

AT [56] REFERENCES CITED

U.S. Patent Documents, insert
--5,239,410  8/1993  Nishimura et al .........359/344--.

Foreign Patent Documents,
"1257386" should read --1-257386--.
"1251685" should read --1-251685--.
"3179428" should read --3-179428--.
"4027183" should read --4-27183--.

Other Publications, Under K. Magari et al.,
"MOW" should read --MQW--.

COLUMN 2

Line 40, "and-second" should read --and second--.

COLUMN 3

Line 31, "a a" should read --a--.

COLUMN 4

Line 23, "an" should read --a--.
Line 64, "an" should read --a--.

COLUMN 5

Line 5, "will" should read --will now--.

UNITED STATES PATENT AND TRADEMARK OFFICE
CERTIFICATE OF CORRECTION

PATENT NO. : 5,488,507
DATED : January 30, 1996
INVENTOR(S) : MICHIYO NISHIMURA

It is certified that error appears in the above-identified patent and that said Letters Patent is hereby corrected as shown below:

<u>COLUMN 6</u>

Line 37, "during of" should read --during--.

Signed and Sealed this

Twenty-fifth Day of June, 1996

Attest:

BRUCE LEHMAN

Attesting Officer     Commissioner of Patents and Trademarks